United States Patent [19]

Kobayashi et al.

[11] Patent Number: 5,460,691
[45] Date of Patent: Oct. 24, 1995

[54] METHOD OF TREATING SURFACE OF SEMICONDUCTOR SUBSTRATE

[75] Inventors: Kiyoteru Kobayashi; Isao Tottori, both of Hyogo, Japan

[73] Assignee: Mitsubishi Denki Kabushiki Kaisha, Tokyo, Japan

[21] Appl. No.: 227,710

[22] Filed: Apr. 14, 1994

Related U.S. Application Data

[63] Continuation of Ser. No. 836,893, Feb. 19, 1992, abandoned.

[30] Foreign Application Priority Data

Mar. 26, 1991 [JP] Japan ................................ 3-060635

[51] Int. Cl.⁶ ........................................................ B44C 1/22
[52] U.S. Cl. ........................ 156/646.1; 437/946; 437/228
[58] Field of Search ............................. 156/646, 662; 437/946, 228

[56] References Cited

U.S. PATENT DOCUMENTS 5,073,232  12/1991  Ohmi et al. .......................... 156/646
5,089,441  2/1992  Moslehi ................................ 437/225

OTHER PUBLICATIONS

"Gas–Phase Selective Etching of native Oxide", Nobuhiro Miki et al., EEE Transactions on Electron Devices, vol. 37, No. 1, Jan. 1990, pp. 107–115 and p. 572.

*Primary Examiner*—Anthony McFarlane
*Assistant Examiner*—Nhat D. Phan
*Attorney, Agent, or Firm*—Lowe, Price, LeBlanc & Becker

[57] ABSTRACT

It is an object of the present invention to provide a method capable of performing surface treatment of a plurality of semiconductor substrates at one time and treating them uniformly with high selectivity. A plurality of semiconductor substrates having interlayer insulating films thereon are prepared. The plurality of semiconductor substrates are arranged in a vertical direction at predetermined intervals in a reaction chamber so that one face of each faces upwards and the other face of each faces downwards. Etching gas for etching the surfaces of the interlayer insulating films is sent into the reaction chamber in a direction vertical to the surfaces of said semiconductor substrates under low pressure.

10 Claims, 7 Drawing Sheets

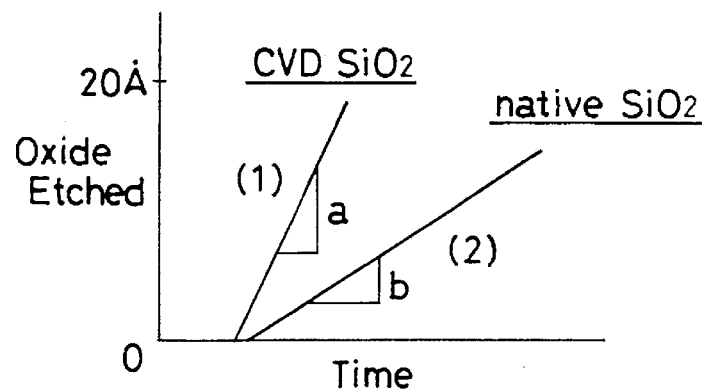
FIG.7(a)
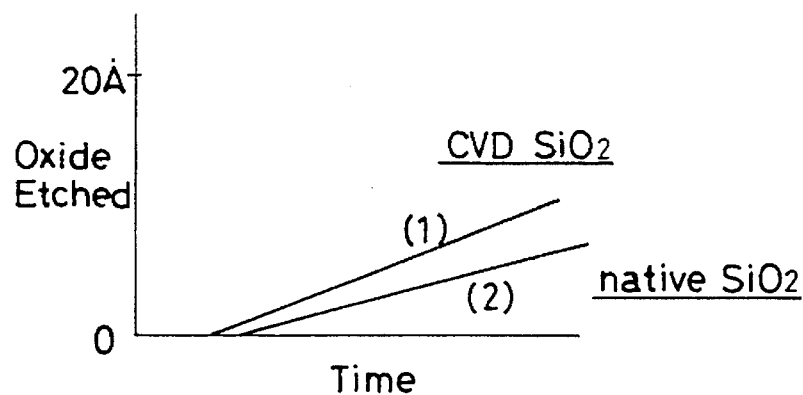
FIG.7(b)
FIG.8
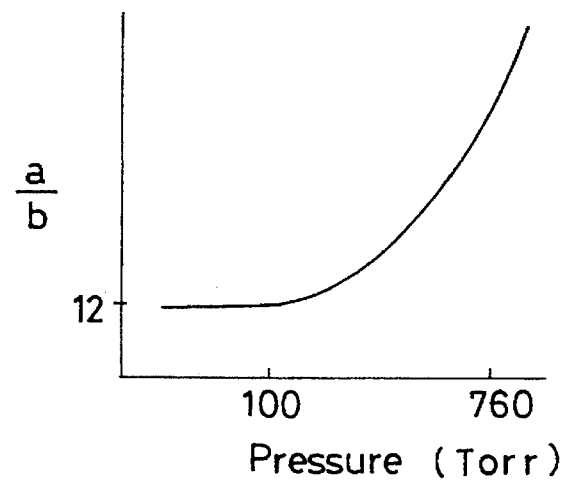

METHOD OF TREATING SURFACE OF SEMICONDUCTOR SUBSTRATE

This application is a continuation of application Ser. No. 07/836,893 filed Feb. 19, 1992 now abandoned.

BACKGROUND OF THE INVENTION

1. Field of the Invention

The present invention generally relates to a method of treating surfaces of semiconductor substrates, and more particularly, to an improved method in which surfaces of a plurality of semiconductor substrates can be treated at one time.

2. Description of the Background Art

FIG. 10 is a conceptual diagram of a conventional etching apparatus. The etching apparatus shown in the figure is used for cleaning semiconductor substrates or for etching away oxide films formed on surfaces of semiconductor substrates. In a conventional etching apparatus, semiconductor substrates are treated one by one.

Referring to FIG. 10, the etching apparatus includes a cylindrical reaction chamber 1. The reaction chamber 1 and a gas bomb 4 in which hydrofluoric acid gas or the like is accommodated are connected to each other by a Teflon pipe 5. Teflon pipe 5 includes a mass flow controller 6 and valve 8 for controlling the flow rate of the hydrofluoric acid gas or the like.

A pipe 7 is connected to Teflon pipe 5 for flowing a nitrogen gas into the Teflon pipe 5. A mass flow controller 10 and a valve 9 for controlling the flow rate of the nitrogen gas are provided in pipe 7.

Reaction chamber 1 and a vacuum pump 11 are connected by a pipe 12. The vacuum pump 11 is used for removing gas or air inside reaction chamber 1. A valve 13 is provided in pipe 12.

A susceptor 3 for supporting a semiconductor substrate 2 such as a silicon substrate is provided in reaction chamber 1. A lid 14 for hermetically closing the reaction chamber 1 is provided over reaction chamber 1.

Next, operation of cleaning semiconductor substrates will be described.

The lid 14 is opened and semiconductor substrate 2 is provided on susceptor 3. The lid 14 is closed. Valves 8 and 9 are closed and a pump 11 is operated with valve 13 being open to exhaust air inside reaction chamber 1. Next, valve 9 is opened for replacement by a nitrogen gas inside reaction chamber 1. Subsequently, valve 8 is opened to introduce a hydrofluoric acid gas or the like into reaction chamber 1. With the hydrofluoric acid gas or the like introduced into reaction chamber 1, cleaning of semiconductor substrate 2 or etching of an oxide film on the surface of semiconductor substrate 2 is performed. Valve 8 is closed for replacement by a nitrogen gas inside reaction chamber 1 again. Subsequently, valve 13 is closed to recover the atmospheric pressure with nitrogen gas inside reaction chamber 1. Lid 14 is opened to take out semiconductor substrate 2. At this time, a semiconductor substrate to be treated next is provided on susceptor 3. After closing lid 14, the above-described process is repeated again.

As described above, semiconductor substrates are treated one by one in a conventional etching apparatus. Accordingly, every time a piece of semiconductor substrate is introduced into reaction chamber 1, air inside reaction chamber 1 had to be exhausted to replace it with nitrogen gas inside reaction chamber 1. Accordingly, it takes a long time to treat a single piece of semiconductor substrate, resulting in a problem that the capability (through put) of treating semiconductor substrates is low.

SUMMARY OF THE INVENTION

It is an object of the present invention to provide a method in which surface treatment can be applied to a plurality of semiconductor substrates at one time.

It is another object of the present invention to provide a method of removing dust attaching on a surface of an interlayer insulating film formed on a semiconductor substrate.

It is still another object of the present invention to provide a method of uniformly removing dust attaching on a surface of an interlayer insulating film formed on a semiconductor substrate so that there is no difference between a peripheral portion and a central portion of the semiconductor substrate.

It is yet another object of the present invention to provide a method for removing a native oxide film on a contact surface existing at a bottom portion of a contact hole provided in an interlayer insulating film.

It is still another object of the present invention to enhance the etching selectivity for a native oxide film in a surface treatment method of a semiconductor substrate including an interlayer insulating film and a native oxide film.

In order to achieve the above objects, a method of treating surfaces of semiconductor substrates according to the present invention relates to a method of removing dust attaching on surfaces of interlayer insulating films formed on the semiconductor substrates. A plurality of semiconductor substrates on which interlayer insulating films are formed are prepared. The plurality of semiconductor substrates are arranged in a vertical direction at predetermined intervals inside a reaction chamber so that one surface of each of them faces upwards and the other surface of each faces downward. Under low pressure, an etching gas for etching the surfaces of the interlayer insulating films is introduced into the reaction chamber in a direction vertical to the surfaces of the semiconductor substrates.

A method of treating surfaces of semiconductor substrates according to another aspect of the present invention relates to a method of removing native oxide films on contact surfaces of semiconductor substrates.

A plurality of semiconductor devices including semiconductor substrates and interlayer insulating films formed on the semiconductor substrates are prepared, in which contact holes are formed for exposing contact surfaces of the semiconductor substrates in the interlayer insulating films 12. The plurality of semiconductor devices are arranged in a vertical direction at predetermined intervals in a reaction chamber so that one surface of each of them faces upwards and the other surface of each faces downwards. Under low pressure, an etching gas for removing native oxide films on the contact surfaces is introduced into the reaction chamber in a direction vertical to the surfaces of the semiconductor devices.

A method of treating surfaces of semiconductor substrates according to still another aspect of the present invention relates to a method of applying etching to silicon oxide films on surfaces of semiconductor substrates. A plurality of semiconductor devices are prepared having silicon oxide films formed thereon. The plurality of semiconductor devices are arranged in a vertical direction at predetermined intervals in a reaction chamber so that one surface of each of them faces upwards and the other surface of each faces downwards. Under low pressure, an etching gas for removing silicon oxide films on the contact surfaces is introduced into the reaction chamber in a direction vertical to the faces of the semiconductor wafers.

According to a method of removing dust attaching on surfaces of interlayer insulating films formed on semiconductor substrates according to the present invention, a plurality of semiconductor substrates are arranged in a vertical direction inside a reaction chamber and they are simultaneously treated, so that the through put is enhanced.

Also, since an etching gas is introduced into the reaction chamber under low pressure, the mean free path of the etching gas molecules is lengthened, resulting in uniform removal of the dust attaching on the surface of the interlayer insulating film formed on the semiconductor substrate without difference between the peripheral portion and the central portion of the semiconductor substrate.

According to a method of removing native oxide films on contact surfaces of semiconductor substrates according to another aspect of the present invention, a plurality of semiconductor devices are arranged in a vertical direction in a reaction chamber and simultaneously treated, so that the through put is enhanced.

Also, since an etching gas is introduced into a reaction chamber under low pressure, in both of interlayer insulating films and native oxide films, the etching selectivity for the native oxide films can be enhanced.

According to a method of etching silicon oxide films on semiconductor substrate surfaces according to still another aspect of the present invention, since a plurality of semiconductor devices are arranged in a vertical direction inside a reaction chamber and simultaneously treated, the through put is enhanced.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 7(a) is a diagram illustrating the etching speed of an interlayer insulating film and the etching speed of a native oxide film in comparison under normal pressure.

FIG. 7(b) is a diagram illustrating in comparison the etching speed of an interlayer insulating film and the etching speed of a native oxide film under low pressure.

FIG. 8 is a diagram in which the ratio of the etching speed of an interlayer insulating film and the etching speed of a native oxide film is plotted as a function of pressure.

DESCRIPTION OF THE PREFERRED EMBODIMENTS

FIG. 1 is a partially cross-sectional view of a semiconductor device in each step in the order of a surface treating method according to the present invention.

Figure 1A:
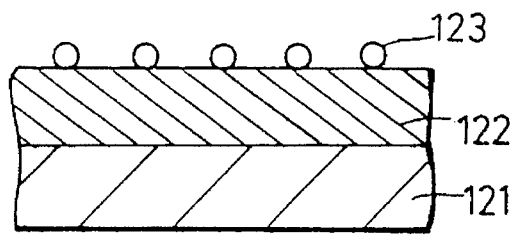
FIGS. 1(a)–(e) are a partially cross-sectional view of a semiconductor device in each process in order of a manufacturing method according to an embodiment of the present invention.

Referring to FIG. 1(a), an interlayer insulating film 122 is formed by the chemical vapor deposition method on a semiconductor substrate 121. An interlayer insulating film 122 is of $SiO_2$, for example. Dust 123 derived from human bodies and an apparatus usually attach on interlayer insulating film 122. One object of the present invention is to remove dust 123 attaching on a surface of interlayer insulating film 122.

Figure 1B:
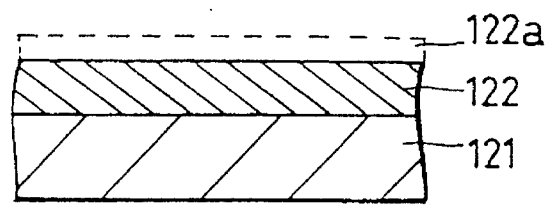

Referring to FIG. 1(b), dust 123 is removed by etching and removing a surface 122a of interlayer insulating film 122 by such a method as will be described later.

Figure 1C:
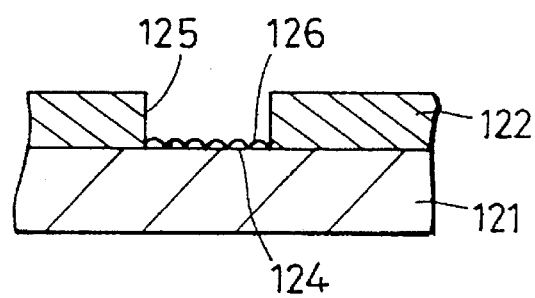

Referring to FIG. 1(c), a contact hole 125 is formed for exposing a contact surface 124 of semiconductor substrate 121 in interlayer insulating film 122. At this time, a native oxide film 126 is formed on contact surface 124. It is the second object of the present invention to remove the native oxide film formed on contact surface 124.

Figure 1D:
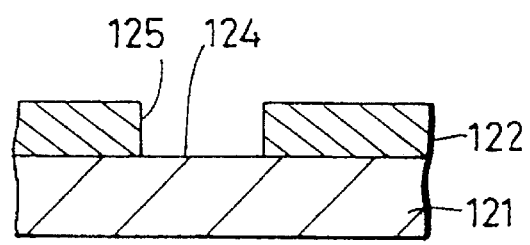

Referring to FIG. 1(d), the native oxide film on contact surface 124 is etched and removed by such a method as will be described later in detail.

Figure 1E:
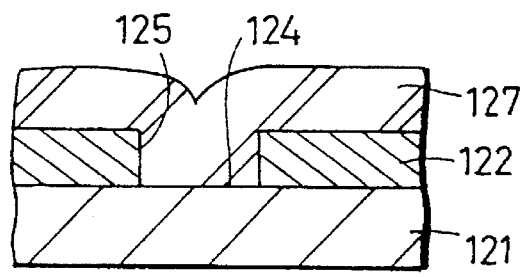

Referring to FIG. 1(e), an aluminum interconnection layer 127 is formed on semiconductor substrate 121 in contact with contact hole 125 to fill up contact hole 125.

Next, a method of treating surfaces of semiconductor substrates will be described in more detail.

Figure 2:
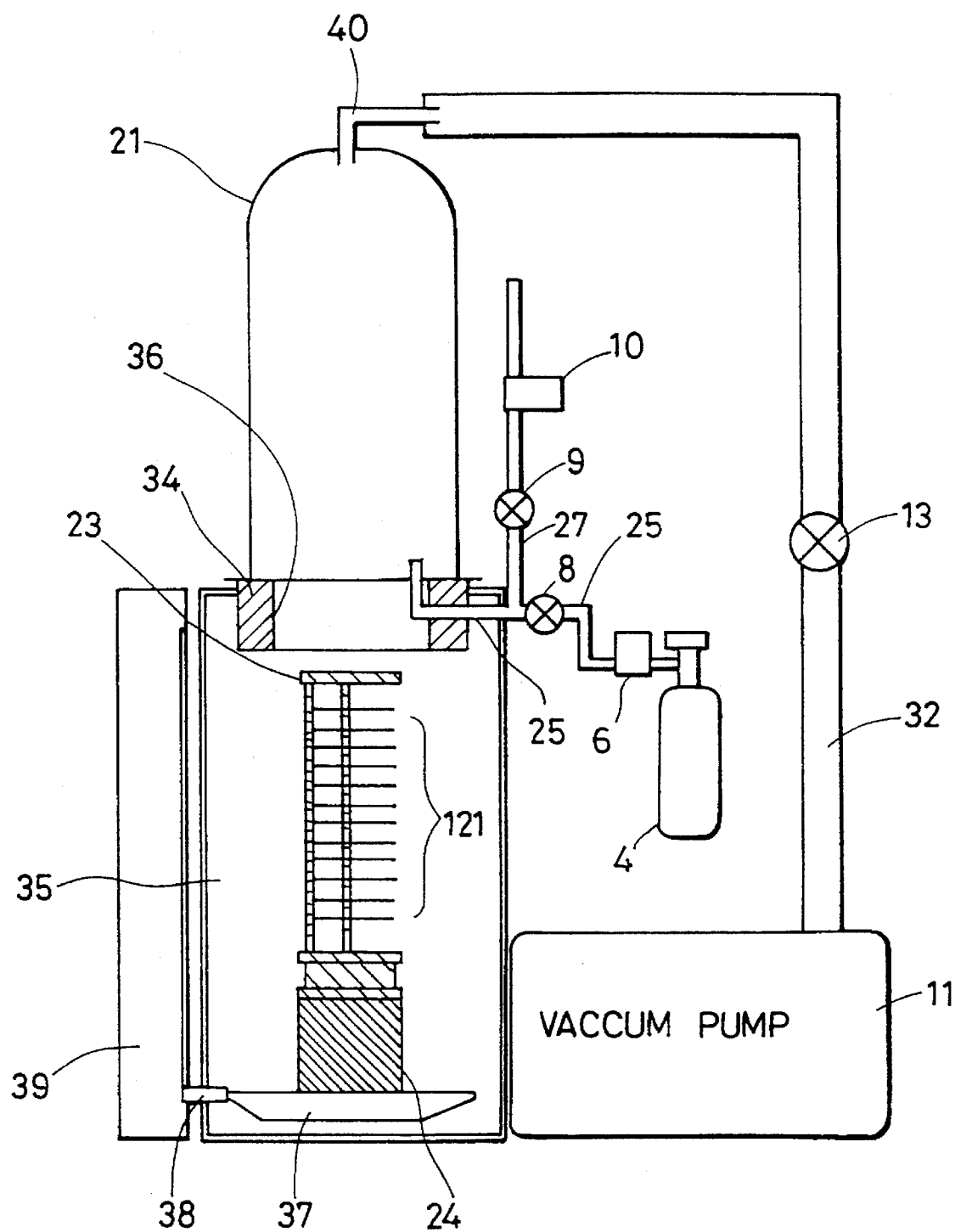
FIG. 2 is a conceptual diagram of an apparatus for implementing a method of the present invention.

FIG. 2 is a conceptual diagram of an etching apparatus performing a method of treating surfaces of semiconductor substrates according to the present invention. The etching apparatus includes a vertical type cylindrical reaction chamber 21. Reaction chamber 21 is carried on and fixed to a manifold 34 provided at an upper portion of a casing 35. A through hole 36 is formed for introducing a susceptor 23 into reaction chamber 21 in manifold 34. The through hole 36 is closed by a lid 37 as will be described later. Susceptor 23 is for holding a plurality of semiconductor substrates 121. Susceptor 23 is supported by a supporting stand 24 fixed on lid 37. Lid 37 is coupled to an elevator 39 by an arm 38. With up and down movement of elevator 39, lid 37 can move upwards and downwards. Lid 37, supporting stand 24 and susceptor 23 are accommodated in casing 35. A pipe 25 for introducing gas from a gas bombe 4 into reaction chamber 21 extends into reaction chamber 21 through manifold 36. A gas flow outlet of pipe 25 faces upwards. A liquid of hydrofluoric acid is stored in gas bombe 4. A mass flow controller 6 and a valve 8 for controlling the flow rate of gas flowing inside pipe 25 are provided in pipe 25. A pipe 27 for introducing nitrogen gas into pipe 25 is connected to pipe 25. Pipe 27 is provided with a mass flow controller 10 and a valve 9 for controlling the flow rate of nitrogen gas. An exhausting pipe 40 is provided in an upper portion of reaction chamber 21. Exhausting pipe 40 is connected to a vacuum pump 11 by a pipe 32. Pipe 32 includes a valve 13.

Figure 3:
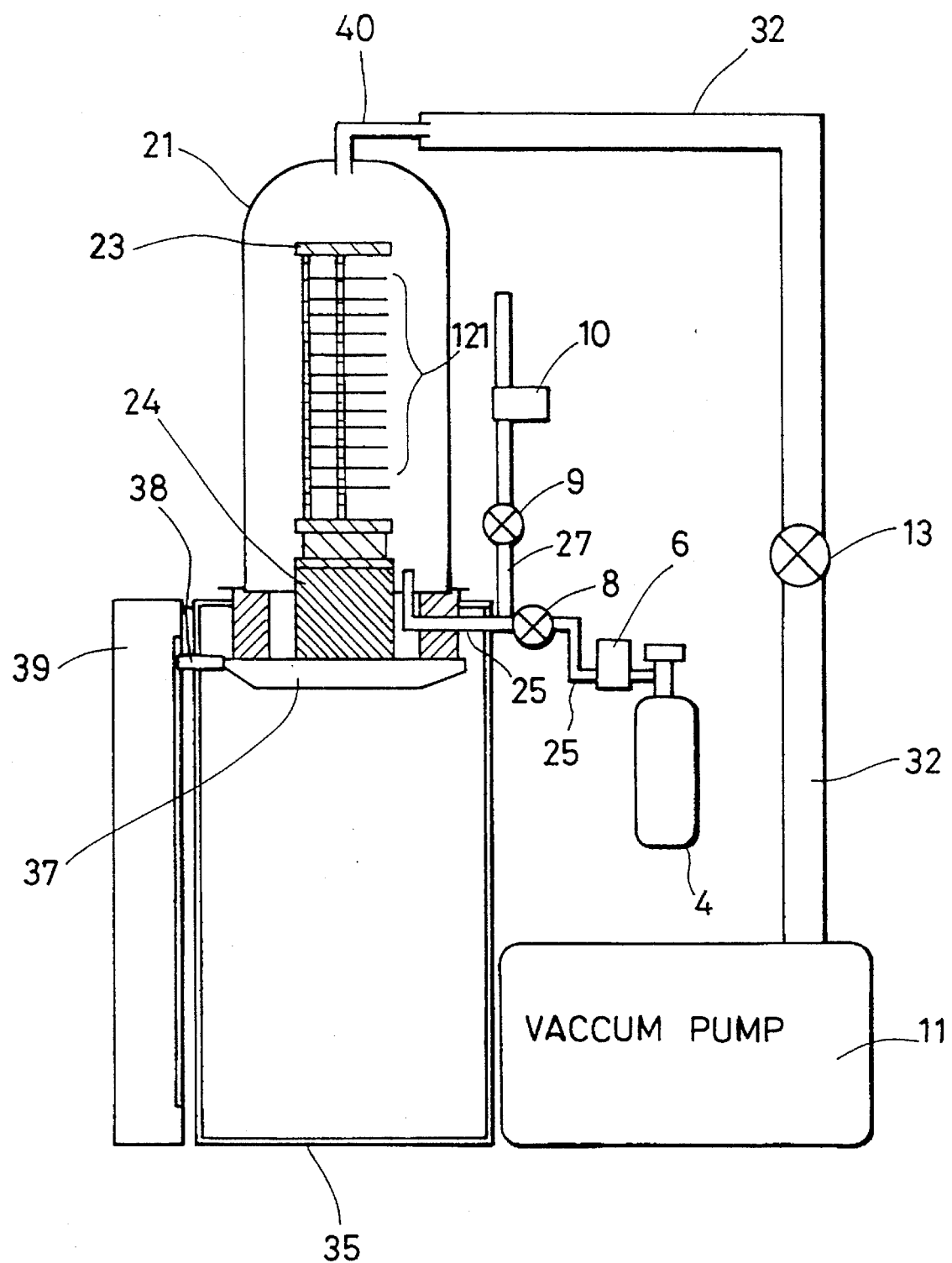
FIG. 3 is a diagram for describing operation of an etching apparatus used in the present invention.

FIG. 3 shows the apparatus with susceptor 23 being put into reaction chamber 21.

Referring to these figures, a method of treating surfaces of semiconductor substrates will be described.

Referring to FIGS. 1(a) and 2, a plurality of semiconductor substrates 121 having interlayer insulating films 122 are held by susceptor 23. The plurality of semiconductor substrates 121 are arranged in a vertical direction at predetermined intervals so that one surface of each of the substrates faces upwards and the other surface of each faces downwards. Usually, about 50 pieces of semiconductor substrates 121 are arranged. The interval between semiconductor substrate 121 and semiconductor substrate 121 is several mm.

Referring to FIG. 3, driving elevator 39, lid 37 is moved upwards to thereby introduce susceptor 23 into reaction chamber 21. When susceptor 23 is completely accommodated in reaction chamber 21, lid 37 is in close contact with manifold 34 so that the reaction chamber 21 is closed.

After closing reaction chamber 21 with lid 37, valve 8 and valve 9 are closed and valve 13 is opened. Under such a condition, pump 11 is operated to exhaust air inside reaction chamber 1. Subsequently, valve 9 is opened for substitution by nitrogen gas inside reaction chamber 21. Subsequently, valve 8 is opened, and then hydrogen fluoride evaporates from the surface of the hydrofluoric acid liquid stored inside gas bombe 4. The evaporated hydrogen fluoride gas is introduced into reaction chamber 21 through pipe 25. The hydrogen fluoride gas is preferably introduced into reaction chamber 21 under low pressure of 0.1–600 Torr.

Figure 4:
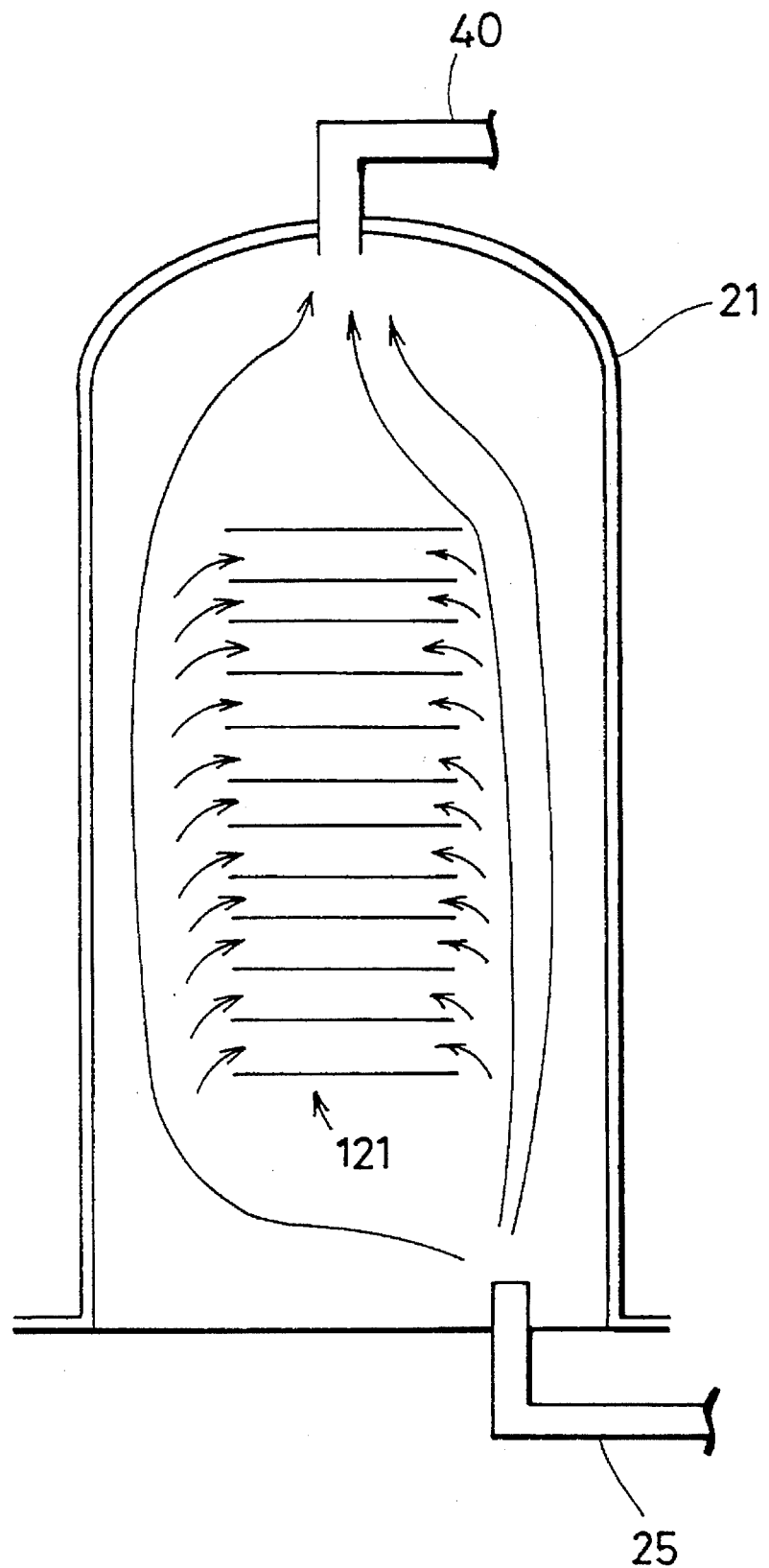
FIG. 4 is a diagram illustrating flow of a hydrogen fluoride gas in a reaction chamber of an etching apparatus used in the present invention.

FIG. 4 shows the flow of the hydrogen fluoride gas when hydrogen fluoride gas is introduced into reaction chamber 21 under such low pressure as mentioned above. Under low pressure, the mean free path of hydrogen fluoride molecules is lengthen and the hydrogen fluoride gas gets into interval portions of semiconductor substrates 121 and semiconductor substrates 121 as shown in the figure. By the hydrogen fluoride gas getting into portion between semiconductor substrate 121 and semiconductor substrate 121, referring to FIG. 1(b), surface 122a of interlayer insulating film 122 is etched and removed according to the reaction formula as shown below.

$$SiO_2 + 4HF \rightleftharpoons SiF_4 + 2H_2O$$

$$2HF + H_2O \rightleftharpoons H_3O^+ + HF_2^-$$

$$SiO_2 + 2H_3O^+ + 2HF_2^- \rightleftharpoons SiF_4 + 4H_2O$$

In the structure in which a mixture gas containing nitrogen gas and HF gas is flown from bottom to top as described above, concentration distribution of the HF gas in the mixture gas is uniform in a horizontal plane to prevent unevenness of etching.

By etching and removing the surface 122a of interlayer insulating film 122, dust 123 is removed.

Figure 5:
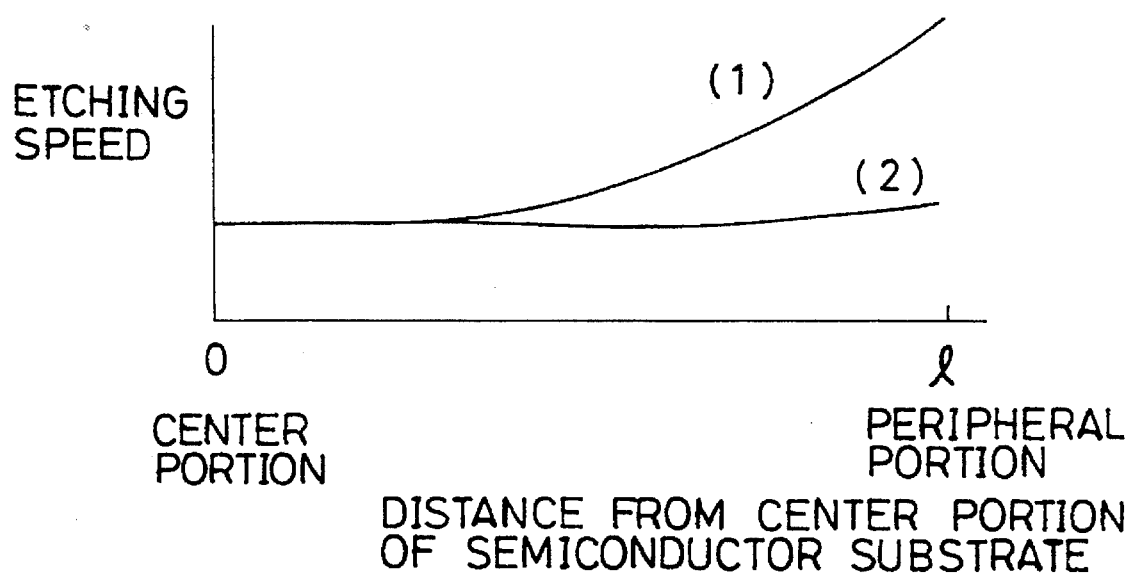
FIG. 5 is a relational diagram between the distance from the center of a semiconductor substrate and the etching speed.
Figure 6:
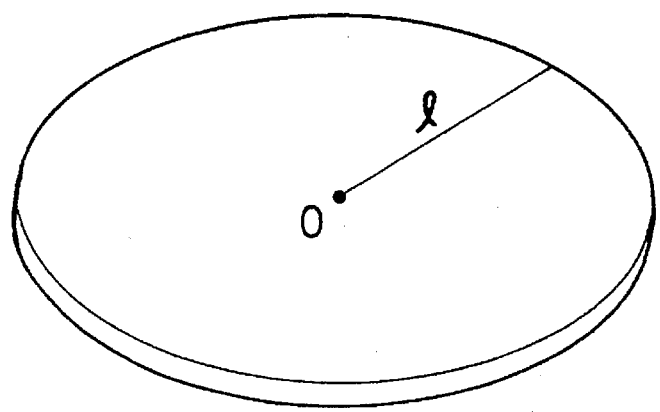
FIG. 6 is a perspective view of a semiconductor substrate.

FIG. 5 is a relational diagram of the distance from the center portion of a semiconductor substrate and the etching speed. FIG. 6 is a perspective view of a semiconductor substrate. In FIG. 5, the curve (1) is a relational diagram in the case where hydrogen fluoride gas is introduced into reaction chamber 21 under normal or lower pressure, and the curve (2) is a relational diagram in the case where the hydrogen fluoride gas is introduced into reaction chamber 21 under low pressure of 0.1–600 Torr. As clearly seen from FIG. 5, if hydrogen fluoride gas is introduced into reaction chamber 21 under low pressure, since the mean free path of the hydrogen fluoride molecules increases, a surface of an interlayer insulating film is evenly etched and removed so that there exists no difference between a peripheral portion and a central portion in a semiconductor substrate.

By the operation as described above, referring to FIG. 1(b), surface portion 112a of interlayer insulating film 122 is removed, thereby removing dust 123.

Next, semiconductor substrates 121 are taken out of reaction chamber 21, and then contact hole 125 is formed for exposing contact surface 124 of semiconductor substrate 121 in interlayer insulating film 122 using another apparatus, referring to FIG. 1(c).

At this time, a native oxide film 126 is formed on contact surface 124.

Next, referring to FIGS. 1(c) and 2, a method of removing native oxide film 126 will be described. Semiconductor substrates 121 in which native oxide films 126 are formed are held by susceptor 23. A plurality of semiconductor substrates 121 are provided in a vertical direction at predetermined intervals so that one surface of each faces upwards and the other of each faces downwards.

Referring to FIG. 3, elevator 39 is driven to move lid 37 upwards, thereby introducing susceptor 23 into reaction chamber 21. When susceptor 23 is completely accommodated inside reaction chamber 21, lid 37 contacts closely to manifold 34 so that reaction chamber 21 is closed. After closing reaction chamber 21 with lid 37, valve 8 and valve 9 are closed and valve 13 is opened. In this condition, using pump 11, air inside reaction chamber 1 is exhausted. Next, valve 9 is opened for substitution by nitrogen gas inside reaction chamber 1, and then valve 8 is opened. Thus, hydrogen fluoride evaporates from the surface of the hydrofluoric acid liquid stored in gas bombe 4 and the evaporated hydrogen fluoride gas is introduced into reaction chamber 21 through pipe 25. The hydrogen fluoride gas is introduced into reaction chamber 21 under low pressure of 0.1–600 Torr, preferably 50–200 Torr.

FIGS. 7(a) and (b) are diagrams illustrating in comparison etching speeds of interlayer insulating film 122 which is a silicon oxide film (simply referred to as CVD $Si_2O_2$, hereinafter) formed by the chemical vapor deposition method and native oxide film 126. In FIG. 7, an etched film thickness of an oxide film is indicated on the coordinates and time is indicated on the abscissa. The straight line (1) indicates the etching speed of an interlayer insulating film and "a" indicates a value of the etching speed. The straight line (2) indicates the etching speed of a native oxide film and "b" indicates a value of the etching speed.

FIG. 7(a) show etching speeds of films respectively when hydrogen fluoride gas is introduced into reaction chamber 21 under ordinary or higher pressure.

FIG. 7(b) indicates etching speeds of respective films when hydrogen fluoride gas is introduced into reaction chamber 21 under low pressure of 50–200 Torr. When introducing hydrogen fluoride gas under low pressure of 50–200 Torr, the etching speed of the interlayer insulating film (curve (1)) considerably decreases. This teaches that the etching selectivity increases for a native oxide film under low pressure.

In FIG. 8, the ratio of the etching speed (a) of an interlayer insulating film and the etching speed (b) of a native oxide film is plotted for the degree of reducing pressure. When it is 100 Torr or lower, a/b is lower than 12, which shows that the etching selectivity increases for a native oxide film as compared to the case of ordinary pressure.

Although the case has been illustrated where the etching selectivity for a native oxide film is increased by changing pressure in the above embodiment, the etching selectivity can be changed by changing the proportion of mixing nitrogen gas which is an inactive gas and HF gas in etching gas, too. It has been recognized that mixed etching gas containing 0.5–2 volume % of HF gas in nitrogen gas has high etching selectivity for a native oxide film.

Another advantage of etching using HF gas is that the etching apparatus shown in FIG. 2 can be integrated with a CVD chamber. If they can be integrally formed, referring to FIGS. 1(a) and (b), the process of forming interlayer insulating film 122 with a CVD apparatus and the process of etching and removing surface 122a of the interlayer insulating film to remove dust 123 can be smoothly proceeded.

Figure 9:
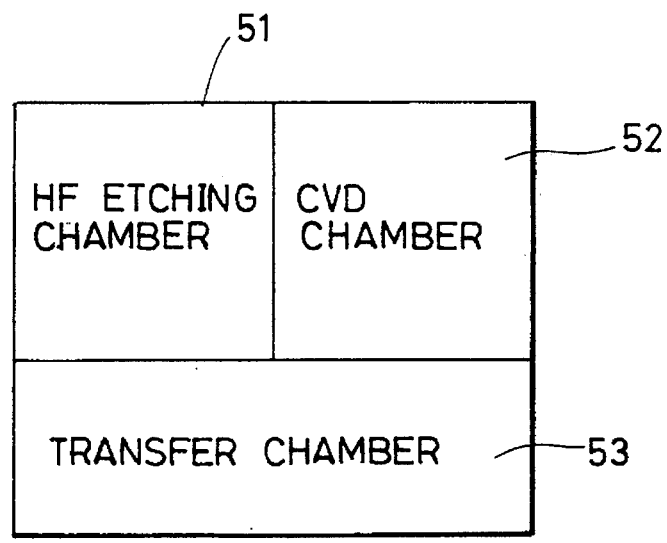
FIG. 9 is a conceptual view of an apparatus in which an HF etching chamber and a CVD are integrated.
Figure 10:
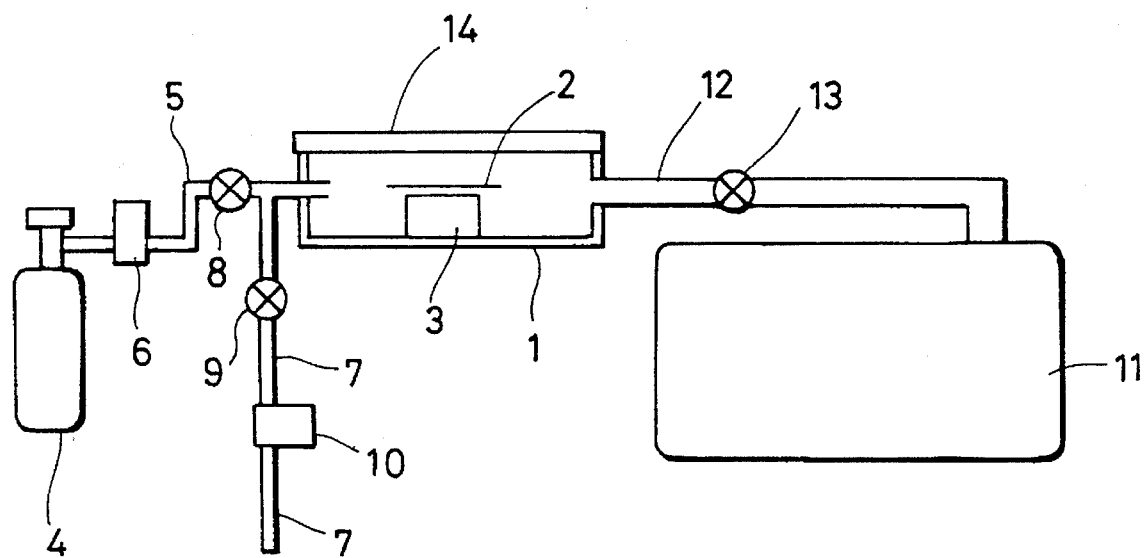
FIG. 10 is a conceptual view of a conventional surface treatment apparatus for semiconductor substrates.

FIG. 9 is a conceptual diagram of an apparatus in which an etching chamber using HF gas and a CVD chamber are integrally formed. The apparatus includes a HF etching chamber 51, a CVD chamber 52 and a transfer chamber 53. The operation thereof will be described.

Referring to FIGS. 1(a), (b) and 9, interlayer insulating film 122 is formed on semiconductor substrate 122 inside CVD chamber 52. Subsequently, substrate 121 is transferred into transfer chamber 53 under nitrogen atmosphere. Subsequently, semiconductor substrate 121 is transferred from transfer chamber 53 to HF etching chamber 51 under the nitrogen atmosphere. Surface 122a of the interlayer insulating film is etched to be removed in HF etching chamber 51, thereby removing dust 123. According to the apparatus, since semiconductor substrate 121 can be transferred from the CVD chamber to the HF etching chamber under the nitrogen atmosphere, the amount of the dust attaching on interlayer insulating film 122 is reduced to produce an effect that an apparatus having excellent semiconductor characteristic can be obtained.

Although the case has been illustrated where HF is used as etching gas in the above embodiment, the present invention is not limited to the same, and gases containing fluorine such as $NF_3$ gas and the like are preferably used. Also, although nitrogen has been illustrated as inactive gas in the above embodiment, the present invention is not limited to the same.

Furthermore, the cases have been illustrated where dust attaching on a surface of an interlayer insulating film formed on a semiconductor substrate is removed and a native oxide film on a contact surface of a semiconductor substrate is removed in the above embodiment, but the present invention is not limited to the same and can be preferably introduced for applying an etching process to a silicon oxide film of a semiconductor substrate surface.

As described above, according to a method of treating a surface of a semiconductor substrate in accordance with the present invention, since a plurality of semiconductor substrates can be arranged in a vertical direction inside a reaction chamber to be simultaneously treated, the through put of the surface treatment is enhanced.

Also, since etching gas is introduced into a reaction chamber under low pressure, the mean free path of molecules of the etching gas is lengthened to produce an effect that dust attaching on a surface of an interlayer insulating film formed on a semiconductor substrate can be uniformly removed so that there is no difference between a peripheral portion and a central portion of a semiconductor substrate.

Furthermore, since etching gas is introduced into a reaction chamber under low pressure, in a method of treating surfaces of semiconductor substrates including interlayer insulating films and native oxide films, the etching selectivity for the native oxide films can be improved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of treating surfaces of semiconductor substrates for removing native oxide films on contact surfaces of semiconductor substrates, comprising the steps of:

providing a plurality of semiconductor devices each including a semiconductor substrate and an interlayer insulating film formed on the semiconductor substrate, in which a contact hole for exposing said contact surface of said semiconductor substrate is formed in said interlayer insulating film;

positioning said plurality of semiconductor devices in a vertical direction at preselected intervals in a reaction chamber so that one surface of each faces upwards and another surface of each faces downwards;

introducing an etching gas for removing native oxide films on said contact surface into a lower portion of said reaction chamber, below said plurality of semiconductor devices; and directing said etching gas out of said reaction chamber at an upper portion thereof above said plurality of semiconductor devices so as to cause said etching gas to flow in said reaction chamber in a direction vertical to the faces of said semiconductor devices under low pressure of 0.1 to 600 Torr.

2. The method according to claim 1, wherein said etching gas includes mixture gas of inactive gas and HF.

3. The method according to claim 2, wherein said inactive gas includes nitrogen gas.

4. The method according to claim 2, wherein said mixture gas contains 0.5–2 volume % of said HF gas.

5. The method according to claim 1, wherein said low pressure is 50–200 Torr.

6. A method of treating surfaces of semiconductor substrates for applying an etching process to silicon oxide films on surfaces of the semiconductor substrates, comprising the steps of:

providing a plurality of semiconductor devices having silicon oxide films formed thereon;

positioning said plurality of semiconductor devices in a vertical direction at preselected intervals in a reaction chamber so that one surface of each faces upwards and another surface of each faces downwards; and introducing an etching gas for removing native oxide films on said contact surfaces into a lower portion of said reaction chamber, below said plurality of semiconductor devices; and directing said etching gas out of said reaction chamber at an upper portion thereof above said plurality of semiconductor devices so as to cause said etching gas to flow in said reaction chamber in a direction vertical to the surfaces of said semiconductor devices under low pressure of 0.1 to 600 Torr.

7. The method according to claim 6, wherein said etching gas includes mixture gas of inactive gas and HF.

8. The method according to claim 7, wherein said inactive gas includes nitrogen gas.

9. The method according to claim 7, wherein said mixture gas contains 0.5–2 volume % of said HF gas.

10. The method according to claim 6, wherein said low pressure is 50–200 Torr.

* * * * *